DECODING CIRCUIT WITH NON-LINEAR COMPANDING CHARACTERISTICS

Filed Oct. 8, 1963 2 Sheets-Sheet 1

Inventor
HISASHI KANEKO
By R. H. Morris
Attorney

DECODING CIRCUIT WITH NON-LINEAR COMPANDING CHARACTERISTICS

Filed Oct. 8, 1963 2 Sheets-Sheet 2

Inventor
HISASHI KANEKO

By R. P. Morris
Attorney 3,296,611

DECODING CIRCUIT WITH NON-LINEAR COMPANDING CHARACTERISTICS

Hisashi Kaneko, Tokyo, Japan, assignor to Nippon Electric Company, Limited, Tokyo, Japan, a corporation of Japan Filed Oct. 8, 1963, Ser. No. 314,765
Claims priority, application Japan, Oct. 11, 1962, 37/45,134
2 Claims. (Cl. 340—347)

This invention relates to a decoding circuit having nonlinear decoding characteristics, and more particularly is an improvement in an attenuator group in a local decoding circuit of an encoder with nonlinear quantization and a decoder with nonlinear quantization.

Such circuits circuits may be used in a decoder or an encoder of the feedback or parallel feed forward type used in pulse code modulation (PCM) transmission, analogue-digital or digital-analogue conversion, or telemetering in space communication or the like.

Conversion into digital signals by sampling, quantizing, and encoding continuous or analogue signals representing analogue quantities such as voice, picture, data, or others, provides excellent technical advantages such as decrease in susceptibility of the information to noise during transmission and handling. Although analogue signals or sampled analogue signals are generally quantized with equal quantization steps, some types of analogue signals such as voice signals in which there is a probability of signals of smaller amplitude occurring frequently, are preferably quantized with minor quantization steps for signals of smaller amplitudes as compared with quantization steps for signals of larger amplitudes. For such nonlinear quantization, analogue signals have been either compressed or expanded by an instantaneous compandor, in which the inherent nonlinearity of nonlinear circuit elements such as semiconductor devices or vacuum tubes are utilized, and then quantized linearly. With such nonlinear quantization whose characteristics depend on the inherent non-linearity of nonlinear circuit elements, it has been impossible to obtain uniform nonlinear quantization characteristics because of the temperature dependency and variations of the inherent nonlinearity.

Nonlinear companding characteristics of logarithmic companding characteristics are very often preferred for various reasons, such as the signal-to-error ratio is independent of the input signal levels and that human sense is in logarithmic relation to the stimulus as is known as the Weber-Fechner's law.

Generally, the characteristics of encoding of an encoder of the feedback type are dependent on the characteristics of the local decoding circuit. It is therefore sufficient to discuss the characteristics of a decoding circuit both for encoders of the feedback type and decoders. There have been described decoding circuits for performing logarithmic or other nonlinear quantization without resorting to the inherent nonlinearity of nonlinear circuit elements. Each of the preferred decoding circuits with nonlinear companding characteristics is of the construction such that attenuators each having attenuation ratios interswitchable in accordance with the value of each of the digits of a codeword of a digital signal to be decoded, are connected in cascade. A reference voltage is supplied to an end of the attenuators, and a nonlinearly companded analogue signal corresponding to the codeword is delivered at the other end as the decoded output voltage. A similar circuit is described in Proceedings of the I.E.E., vol. 109 (1962), pages 481–483.

The decoding circuits referred to above are excellent in that they do not depend on the inherent nonlinearity of nonlinear circuit elements and provide nonlinear decoding characteristics with a relatively small number of circuit elements. Such decoding circuits however, are not necessarily preferable in high-speed or high-precision encoding because of the speed and precision limitations in interswitching of the attenuation ratios. More particularly, substitution of one or more active circuit elements such as transistors for mechanical switch with a view to attaining high-speed switching, results in unavoidable passage of the partly decoded analogue signal being handled through the active circuit element which is not directly grounded at a point thereof, because of the fact that at least one of a pair of contacts among some pairs of contacts is not directly grounded or alternatively that a buffer amplifier is disposed in the main path of the partly decoded signal. Consequently, such a decoding circuit will introduce imperfections with respect to the stability against some factors, such as drift of the direct-current level, the temperature dependency and variations of the inherent nonlinearity.

A general object of the invention therefore is to provide a decoding circuit with nonlinear companding characteristics which may be used in an encoder of the feedback type or the parallel feed forward type and in a decoder for stable, high-speed, and high-precision operation and which is composed of only a small number of circuit elements, and which is almost completely free from variations caused by temperature characteristics, stability against drift of the direct-current level, etc.

According to the invention there is provided a decoding circuit with nonlinear companding characteristics comprising (1) a reference power source for providing an electric power for use as a reference and (2) cascaded attenuators each in turn comprising a plurality of passive networks composed of passive circuit elements, such as resistors, and a multistate device or multistate switch which has a plurality of contact pairs or the equivalents for selecting a desired one of the networks with one contact of each paired contacts directly connected to one of a pair of output terminals of the reference power source. In an attenuator according to the invention a point in the multistate switch equivalent to one of each paired contacts is kept at a standard potential which may be the earth potential. Therefore use of one or more active circuit elements, such as transistors, as the multistate switch does not present the problems concerning the stability of direct-current, the temperature dependency and variation of the nonlinearity of the active circuit elements. Also, it is easy with an attenuator according to the invention to make the input impedance equal to a given terminating impedance and consequently to make the characteristic impedance constant throughout the cascaded attenuators and to make the consumption of the power in the attenuators minimum.

Now the principles of the invention will be explained in a case of binary code.

If the code length of a codeword of a digital signal or the number of digits in a codeword is $n$ and if $i$ represents a number between 0 and N ($=2^n$) inclusive, then the number $i$ which represents the ordinal of a quantization level may be given by an $n$-bit binary codeword ($e_1, e_2, \ldots, e_n$) in such a manner that $$N-i=e_1x2^{n-1}+e_2x2^{n-2}+\ldots+e_{n-1}x2+e_n \quad (1)$$

where $e_k$ ($k=1, 2, \ldots, n$) is a binary code of the $k$th digit and is either 0 or 1. By introducing a function $$y=E.r_1^{N-i} \quad (2)$$

of $i$ and by considering another function $$x=y-d \quad (3\text{–}1)$$

where $$d=E.r_1^{N} \qquad (3\text{-}2)$$

and furthermore by using $$r_1=(1+u)^{-1/N} \qquad (3\text{-}3)$$

and $$E_0=E.(1-r_1^{N})=E.u/(1+u), \qquad (3\text{-}4)$$

we can get $$i/N=\log(1+ux/E_0)/\log(1+u) \qquad (4)$$

which shows if $x$ introduced by the Equation (3–1) is an individual voltage taken out of a given analogue signal and if $E_0$ introduced by the Equation (3–4) is a voltage not smaller than the anticipated maximum voltage of the analogue signal, the logarithmic companding characteristic or the mu characteristic discussed by Bernard Smith in "Bell System Technical Journal," May 1957 issue, pp. 653–709 is provided. Incidentally, $y$ and E introduced by the Equation (2) are a preliminary quantized voltage for delivering from the individual voltage $x$ taken out of the given analogue signal the logarithmically companded quantized level $i$ corresponding to such individual voltage $x$ and a reference voltage for delivering such preliminary quantized voltage $y$, respectively; $d$ introduced by the Equation (3–1) gives a minute correction voltage to be reduced from the preliminary quantized voltage $y$ to provide the desired quantized voltage $x$; $r_1$ introduced by the Equation (3–2) gives the first one of attenuation ratios for deriving the preliminary quantized voltage $y$ from the reference voltage E; and $u$ introduced by the Equation (3–3) is a constant for determining the degree of companding and what is usualy written by a Greek letter mu and set at from 100 to 200. By substituting the Equation (1) into the Equation (2) we obtain $$y=E.r_1(e_1x2^{n-1}+e_2x2^{n-2}+e\ \ldots\ +e_n)$$

which may be rewritten into $$y=E.G_1.G_2.\ \ldots\ .G_n \qquad (5)$$

where $$G_k-r_{n-k+1}{}^{e}k=\begin{cases} r_{n-k+1}=r_1{}^{2n-k} \\ \qquad =(1+u)^{-1/2k}, & (\text{when } e_k=1) \\ r_{n-k+1}0=1, & (\text{when } e_k=0), \end{cases} \qquad (6)$$

in which connection, another equation $$G_k'=r_{n-k+1}=r_1^{2n-k}=(1+u)^{-1/2k} \qquad (7)$$

be defined. Inasmuch as $k$ shows the number of the digit, the $k$th digit binary code $e_k$ selected so that a comparison voltage $F.G_1.G_2.\ \ldots\ G_n$ obtained by causing stepwise attenuation to the reference voltage E in the manner indicated by the Equation (5) by means of cascaded $n$ attenuators which each has an attenuation ratio $G_k$ interswitchable between $G_k'$ given by the Equation (7) and 1 or namely interswitchable between attenuation ratios defined by the Equation (6) according to such binary code $e_k$, may be equal to the preliminary quantized voltage $y$ which is the sum of the individual voltage $x$ taken out of the given analogue signal plus the minute correction voltage $d$, will give the desired codeword $(e_1, e_2, \ldots, e_n)$ which is a digital signal resulting by logarithmically companding and encoding the given analogue signal.

While interswitching between two attenuation ratios determined by the Equation (6) may be performed by a two-state switch such as single-pole switches, it is necessary in the case not of a binary code but in general an $m$-ary code, to interswitch by an $m$-state switch a combination of $m$ networks giving $m$ attenuation ratios, respectively.

The above mentioned and other features and objects of this invention and the manner of attaining them will become more apparent and the invention itself will best be understood by reference to the following description of an embodiment of the invention taken in conjunction with the accompanying drawings wherein.

Figures 2, 3, 4, 5, 6:
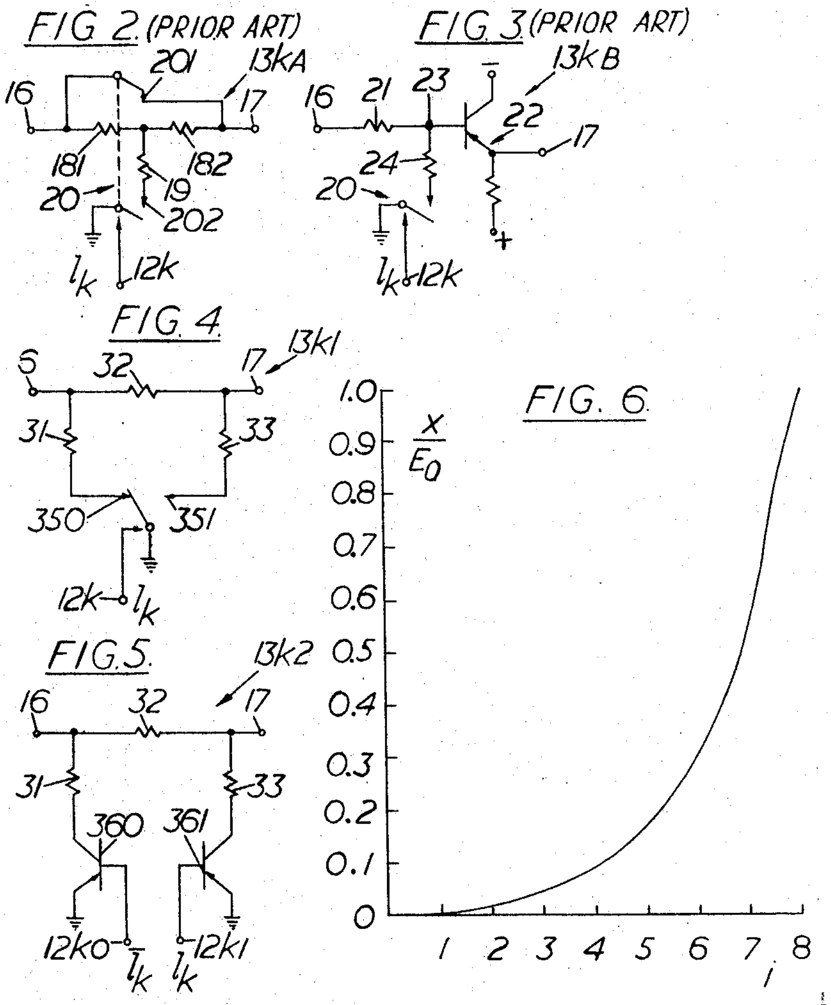
FIG. 2 (PRIOR ART), FIG. 3 (PRIOR ART), FIG. 4, FIG. 5, FIG. 6
FIGS. 2 and 3 are circuit diagrams of already proposed attenuators for use in the decoding circuit shown in FIG. 1.
FIG. 4 is a circuit diagram of an example of an attenuator according to the invention.
FIG. 5 is a circuit diagram of a modification of the attenuator shown in FIG. 4.
FIG. 6 is a graph showing the characteristic of an embodiment of the invention wherein attenuators similar to that shown in FIGS. 4 or 5 are used.
Figures 7, 8, 9, 10:
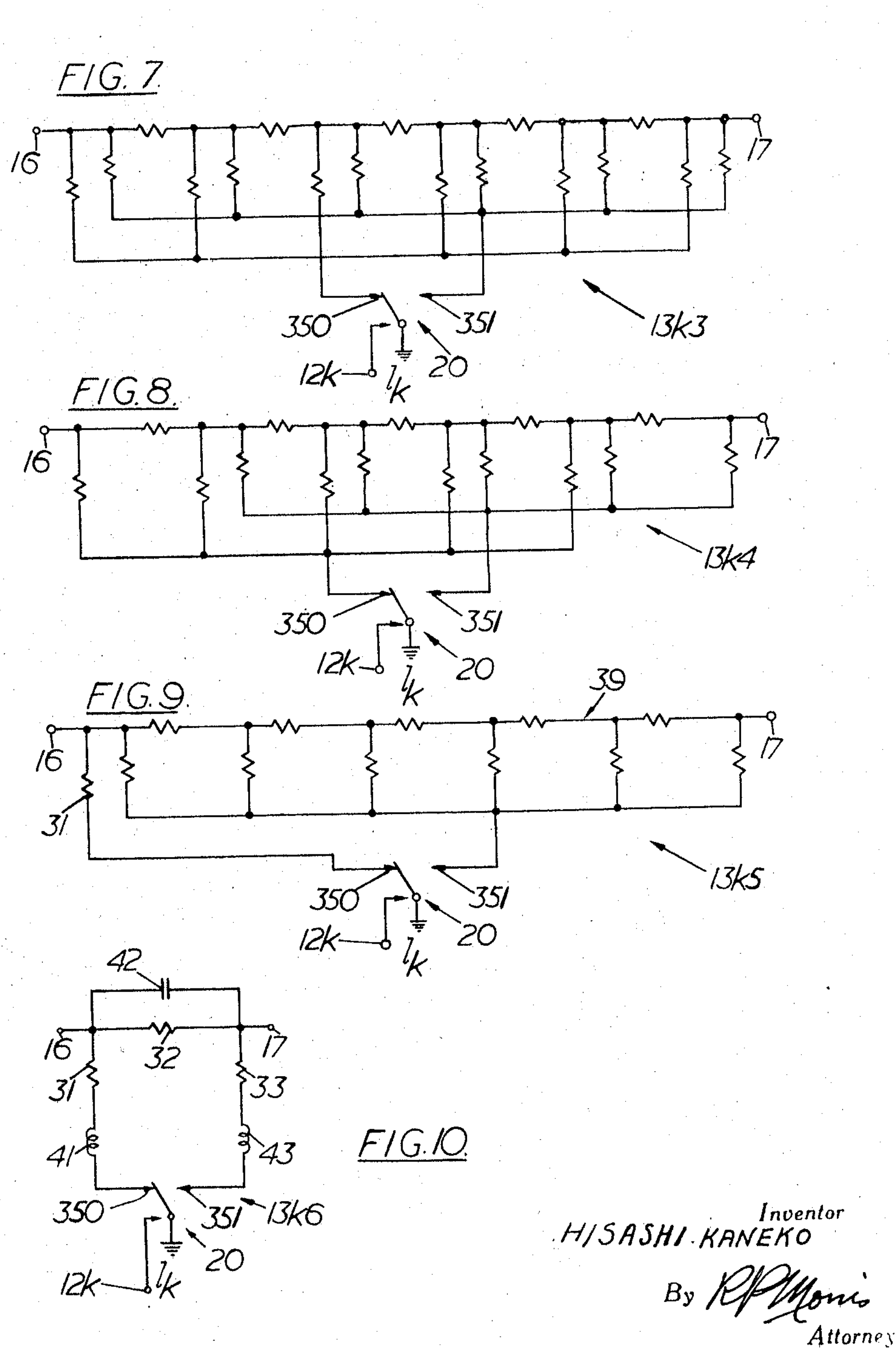

FIGS. 7, 8, and 9 are circuit diagrams of further modifications of the attenuator shown in FIG. 4; and FIG. 10 is a circuit diagram of a still further modification of the attenuator shown in FIG. 4.

Figure 1:
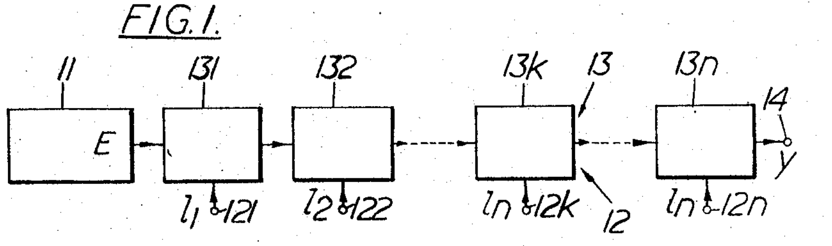
FIG. 1 is a block diagram of an already proposed decoding circuit with non-linear quantization which may incorporate the novel attenuators of this invention.

Referring to FIG. 1, a proposed decoding circuit comprises a reference power source 11 for providing a predetermined reference voltage E or the sum of a voltage $E_0$ which is not smaller than the maximum value of the analogue voltage $x$ to be obtained as a result of decoding plus the minute correction voltage $d$ given by the Equation (3–2); an input terminal group consisting of $n$ input terminals 21, 122, . . . , 12$k$, . . . , and 12$n$ supplied as control inputs with codes $e_1, e_2, \ldots, e_k, \ldots,$ and $e_n$ of every digit of an $n$-bit input digital signal $(e_1, e_2, \ldots, e_k, \ldots, e_n)$ to be decoded, respectively; an attenuator group 13 consisting of $n$ cascaded attenuators 131, 132, . . . , 13$k$, . . . , and 13$n$ which attenuate at each stage the reference voltage E and which each has an attenuation ratio $G_k$ interswitchable between $G_k'$ given by Equation (7) and 1 in the manner determined by the Equation (6) or according as the control input $e_k$ is 1 and 0; and an output terminal 14 for delivering the output power of the last-stage attenuator 12$n$ as the sum voltage $y$ of the desired analogue signal voltage $x$ plus the minute correction voltage $d$ introduced by the Equation (3–2). The voltage $y$ obtained at the output terminal 14 may be considered as the resulting decoded analogue signal.

Referring next to FIG. 2, an attenuator 13$k$A as proposed in the Japanese application No. 36,279 as the attenuator 13$k$ comprises a partly-decoded signal input terminal 16 to be connected to either the reference power source 11 or the preceding stage attenuator 13$k-1$; a partly-decoded signal output terminal 17 to be connected to the succeeding-stage attenuator 13$k+1$ or the output terminal 14; a control signal input terminal 12$k$ connected to an operating circuit or device to control the switches, the device is not shown except by an arrow head but may be a relay or an electronic circuit closer of any kind; a known T type balanced attenuator in turn comprising two equivalent resistors 181 and 182 serially connected between the input and the output terminals 16 and 17 and another resistor 19 which can be interposed between a junction point of the two resistors 181 and 182 and the earth; a double-pole two-state switch 20 for either connecting the T balanced attenuator to the input and the output terminals 16 and 17 and the earth or short-circuiting the input and the output terminals 16 and 17 and at the same time isolating the terminals 16 and 17 from the earth. The two-state switch 20 performs when the control input $e_k$, is 0, a function corresponding to closing of a contact pair 201 disposed in the short circuit between the input and the output terminals 16 and 17 and opening of another contact pair 202 disposed between the resistor 19 and the earth. With the attenuator 13$k$A, selection of the resistors 181, 182, and 19 performed in the manner taught in the parent specification renders the characteristic impedance unchanged even though the control input $e_k$ may be 1 or 0.

Consequently, it is possible by selection of the terminating impedance to be connected to the output terminal 17 that the same may remain unchanged even if the control input $e_k$ may be 1 or 0, to keep the impedance of the attenuator 13$k$A as seen from the input terminal 16 constant though the control input $e_k$ may assume the value of 1 or 0. It is thus possible with use of the attenuator 13$k$A wherein the receiving-end impedance does not vary whichever of the values 1 and 0 the control input $e_k$ may assume, to cause the attenuation ratio $G_k$ of any stage of the cascaded attenuators 131–13$n$ to vary only according to the control input $e_k$ of the particular stage and not to be influenced by the control inputs of other stages. It is to be noted, however, that the attenuator 13$k$A still has the defect mentioned in the preamble of the specification because either end of the contact pair 201 of one of the contact pairs of the two-state switch 20 is not directly connected to the earth but one end of such contact pair 201 is in the main path of the partly decoded signal.

Referring to FIG. 3, another attenuator 13$k$B proposed in the Japanese application 36,279 comprises a series connection of a resistor 21 and an emitter follower or other buffer amplifier 22 disposed between a partly decoded signal input terminal 16 and a partly decoded signal output terminal 17; a resistor 24 which is connected at one end to a junction point 23 between the resistor 21 and the buffer amplifier 22; and a two-position switch 20 for closing or opening the connection between the other end of the resistor 24 and the earth according as the control input $e_k$ supplied to a control input terminal 12$k$ is 1 or 0. With the attenuator 13$k$B, utilization of the very large input impedance of the buffer amplifier 22 makes it possible to interswitch the attenuation ratio $G_k$ while utilization of very small impedance thereof enables to make the sending end impedance substantially zero. It is thus possible with the attenuator 13$k$B to let the attenuation ratio $G_k$ of whichever stage of the cascaded attenuators 131–13$n$ change according to only the control input $e_k$ to the particular stage and not be affected by the control inputs to the other control stages. It is also to be noticed, however, that the attenuator 13$k$B yet has the defect pointed out in the preamble of the specification because the buffer amplifier 22 is disposed in the path of the partly decoded signal and neither end of the active circuit element of the buffer amplifier 22 is directly connected to the earth.

Referring to FIG. 4, an attenuator 13$k$1 according to the invention comprises a partly decoded signal input terminal 16 to be connected to a reference power source 11 or a preceding attenuator 13$k$—1, a partly decoded signal output terminal 17 to be connected to the succeeding attenuator 13$k$+1 or an output terminal 14; a control signal input terminal 12$k$ supplied with the control input $e_k$; an input-side resistor 31 connected at one end to the input terminal 16; an inter-input-and-output resistor 32 interposed between the input and the output terminals 16 and 17; an output-side resistor 33 connected at one end to the output terminal 17; and a two-state switch 20 for bringing either of a 0 contact 350 disposed at the other end of the input-side resistor 31 or a 1 contact 351 installed at the other end of the output-side resistor 33 into a state wherein the contact 350 of 351 is connected to a standard potential such as the earth according as the control input $e_k$ is either 0 or 1.

Although the attenuator 13$k$ or 13$k$1 is illustrated in FIG. 1 or 4 for simplicity as if the same were connected by a single wiring to the reference power source 11 or the preceding or the succeeding attenuator, it is to be noted that the reference voltage E produced by the reference power source 11 refers to the standard potential. Furthermore, the reference voltage is a predetermined voltage which may be a constant direct-current or alternating-current voltage or a voltage varying exponentially with time. It is also to be noticed that the number of stages each including such an attenuator 13$k$1 and the associated control input terminal, may be equal in the case of a parallel feed forward encoder to the number of digits for which decoding is required among the digits constituting the codeword of a digital signal, such as only one for the most significant digit, two for the most significant and the next digits, or the like.

In the general case of an $m$-ary code other than binary, a digit pulse of a particular digit or the control input $e_k$ assumes from time to time not either of 0 and 1 but one of $m$ values $e_k1$, $e_k2$, . . . , and $e_{km}$. Between the output terminal pair of the last-stage attenuator and the analogue signal voltage output terminal pair 14 for delivering a quantized analogue signal voltage representing at least a digit pulse supplied to the control input terminal pair, interposition is possible of a biassing source for providing corrections of the minute correction voltage $d$, and/or an amplifier and an attenuator.

In the attenuator 13$k$1 shown in FIG. 4, either of a passive circuit element network composed of the input-side resistor 31 and inter-input-and-output resistor 32 or another passive circuit element network composed of the inter-input-and-output resistor 32 and the output-side resistor 33 is arranged to be connected, according as the control input $e_k$ is either 0 or 1, to either the 0 or the 1 contact 350 or 351 which may be considered as a point in the two-state switch 20, to the illustrated input and output terminals 16 and 17, and to the earth or the input and the output terminals paired with such illustrated terminals. In an attenuator to be used with an $m$-ary code, the arrangement is such that $m$ circuit networks may be formed among a plurality of resistors or other passive circuit elements and that the $m$-state switch may connect in one of its states that one of the circuit element networks which is assigned to the state to a pair of input terminals with a point in the particular circuit element network grounded through such a point in the multi-state switch as may always be grounded.

If on determining the resistances of the resistors in the attenuator 13$k$1 shown in FIG. 4 the resistors 31, 32, and 33 have specific resistances $R_1$, $R_2$, and $R_3$ when the terminating impedance is assumed for simplicity to be unity, then attenuation ratios $g_0$ and $g_1$ of the attenuator 13$k$1 when the control input $e_k$ is 0 and 1 are given by $$g_0=1/(R_2+1)$$

and $$g_1=R_3/(R_2+R_3+R_2R_3) \tag{8}$$

and the input impedances $Z_{i0}$ and $Z_{i1}$ are given by $$Z_{i0}=R_1(R_2+1)/(R_1+R_2+1)$$

and $$Z_{i1}=R_2+R_3/(R_3+1)=(1-g_0)/[g_0(1-g_0G_k)] \tag{9}$$

for the respective cases. Inasmuch as the attenuation ratio $G_k$ of the attenuator 13$k$1 is not unity but $g_0$ when the control input $e_k$ is 0, the desired attenuation ratio $G_k$ is given by $$G_k'=g_1/g_0$$

and the specific resistances $R_2$ and $R_3$ are at first so selected that a relation $$G_k'=R_3(R_2+1)/(R_2+R_3+R_2R_3) \tag{10}$$

may hold. The specific resistance $R_1$ is then selected so that the input impedance $Z_i$ of the attenuator 13$k$1 may not vary even though the control input $e_k$ may become either 0 or 1. Therefore, relations $$R_1=(1-g_0)/[g_0^2(1-G_k')]$$

$$R_2=(1-g_0)/g_0$$

and $$R_3=G_k'(1-g_0)/(1-G_k') \tag{11}$$

follow. The attenuation ratio $g_0$ of the attenuator 13$k$1 in case the control input $e_k$ is 0 may optionally be selected. Most preferably, such attenuation ratio $g_0$ is determined so that the electric power of the partly decoded signal transmitted from the input terminal 16 to the output terminal 17 may be maximum or that the power consumption in the attenuator 13$k$1 may be minimum or, by other expression that the input impedance $Z_i$ may be equal to the terminating impedance which is equal to 1. By so determining the characteristic impedance of the cascaded attenuators 131, 132, . . . , 13$n$ are made invariant throughout the stages. The attenuation ratio $g_0$ and the specific resistances $R_1$, $R_2$, and $R_3$ are then selected so that relations $$g_0=[1-\sqrt{(1-G_k)}]/G_k'$$

$$R_1=[1+\sqrt{(1-G_k')}]/\sqrt{(1-G_k')}$$

$$R_2=\sqrt{(1-G_k')} \qquad (12)$$

and $$R_3=[1-\sqrt{1-G_k'})]/\sqrt{(1-G_k')}$$

may hold. If the terminating impedance is not 1 but is made equal to the characteristic impedance $Z_0$, the desired resistances of the resistors 31, 32, and 33 are $Z_0R_1$, $Z_0R_2$, and $Z_0R_3$, respectively.

The decoding circuit may comprise an attenuator described with reference to FIG. 4, although the attenuation ratio $G_k$ of such an attenuator is not equal to that given by the Equation 6 but to the attenuation ratio $g_0$ given by the Equation 8 or preferably by the Equation 12 when the control input $e_k$ is 0. If such attenuation ratio of the attenuator 13$k$ be $g_{0k}$, the decoding circuit has an additional attenuation ratio of $$g=g_{01}\cdot g_{02}\cdot \ . \ . \ . \ \cdot g_{0n}$$

which is independent of whichever value of 0 and 1 the control input to any one of the stages may assume. The additional attenuation ratio $g$ may be compensated by correspondingly raising the reference voltage, or by installing an amplifier just prior to or somewhere posterior to the output terminal 14.

Referring to FIG. 5, an attenuator 13$k$2 which is a modification of the attenuator 13$k$1 shown in FIG. 4 for use in high-speed encoding, comprises in place of the control input terminal 12$k$ a 0 control input terminal 12$k$0 for receiving a radix-minus-one's complement $\bar{e}_k$ of the control input and a 1 control input terminal 12$k$1 for receiving the control input $e_k$ per se, and as the two-state switch 20 a 0 transistor 360 which becomes "on" or "off" according as the control input $e_k$ to the 0 control input terminal 12$k$0 is 1 or 0 or according as the control input $e_k$ to such two-state switch 20 is 0 or 1, and a 1 transistor 361 which turns "on" and "off" according as the control input $e_k$ is 1 or 0. Either of the transistors 360 and 361 may be connected at one of its electrodes directly to the standard potential and is not disposed in the main path of the partly decoded signal, with the result that only negligible effect appears as a consequence of the drift in the transistors 360 and 361 at those input and output terminals 16 and 17 which are remote from the point maintained at the standard potential.

With the attenuator 13$k$1 of FIG. 4 or the attenuator 13$k$2 of FIG. 5, selection of the constant $u$ for giving the degree of companding characteristic at 100, the code length $n$ at 3, and the characteristic impedance at 1 kilo-ohm results in the attenuation ratio $G_k'$, the resistances $R_1'$, $R_2'$, and $R_3'$ of the input-side, the inter-input-and-output, and the output-side resistors 31, 32, and 33, the additional attenuation ratio $g_0$ for each stage, and the power consumption in each stage, given in Table 1. The resistances $R_1'$, $R_2'$, and $R_3'$ shown in Table 1 are readily realizable.

TABLE 1

| k | $GG_k'$ | $R_1'$, KΩ | $R_2'$, KΩ | $R_3'$, KΩ | $g_0$ | Power consumption, percent |
|---|---|---|---|---|---|---|
| 1 | 0.0995 | 2.052 | 0.9487 | 0.0520 | 0.513 | 73.68 |
| 2 | 0.3154 | 2.208 | 0.8195 | 0.208 | 0.550 | 18.36 |
| 3 | 0.5616 | 2.509 | 0.6630 | 0.509 | 0.602 | 5.08 |

FIG. 6 shows in respect of an attenuator group given in Table 1 the relation between the number $i$ of the quantization level and the relative value $x/E_0$ of the corrected logarithmically decoded analogue signal voltage. Incidentally, that the number $i$ is 1, 2, . . . , or 8, corresponds to the codeword 111, 110, . . . , or 000. The graph obtained conforms to the mu characteristics as defined by Bernard Smith.

Referring next to FIGS. 7, 8, and 9, each of the illustrated attenuators 13$k$3, 13$k$4, and 13$k$5 which are further modifications of the attenuator 13$k$1 shown in FIG. 4, comprises a two-stage switch 20 supplied with the control input $e_k$ and serving to connect either the 0 contact 350 or the 1 contact 351 to the standard potential or the earth according as the control input $e_k$ is either 0 or 1; and a resistor combination composed of such networks of a plurality of resistors that connection of either the 0 contact 350 or the 1 contact 351 to the earth may bring the corresponding resistor network into connection to the input and the output terminal pairs and that either of the resistor network may be connected to the earth through such a point in the two-state switch 20 as may be connected either to the 0 contact 350 or the 1 contact 351.

In each of the attenuators 13$k$3 and 13$k$4 shown in FIGS. 7 and 8, resistance of the resistors in the resistor networks are so determined that the ratio of the attenuation ratio $g_1$ which the attenuator has when the two-state switch 20 closes the 1 contact 351 and opens the 0 contact 350 to the attenuation ratio $g_0$ which the attenuator has when reversed, may be equal to $G_k'$ and that the input impedance $Z_i$ of the attenuator may not be dependent on the state of the two-state switch 20. The selection can be carried out, although complicated as compared with that for the attenuators 13$k$1 and 13$k$2 shown in FIGS. 4 and 5, by means of an electronic computer.

The attenuator 13$k$5 shown in FIG. 9, is so arranged that when the two state switch 20 grounds the 0 contact 350, a resistor network may be connected to the four input and output terminals with the 0 contact 350 in the network grounded or more particularly, that the input-side resistor 31 may be connected between the input terminal pair, with a ladder resistor network 39 connected between the illustrated input and output terminals 16 and 17 and with the not-illustrated earth-side input and output terminals grounded, and that when the two-state switch 20 grounds the 1 contact 351, another resistor network composed only of the ladder resistor network 39 may be connected to the four input and output terminals with the 1 contact 351 in the network connected to the earth. With this attenuator 13$k$5, it is possible like the attenuator 13$k$1 to make by selection of the resistance of the input-side resistor 31, the input impedance $Z_i$ independent of whichever of 0 and 1 the control input $e_k$ may assume. Furthermore, it is possible to determine, although complicated, the resistances of the resistors in the ladder resistor network 39 by means of an electronic computer so as to provide the desired attenuation ratio $G_k$. Such attenuators 13$k$3, 13$k$4 and 13$k$5 have merits of decreasing the additional attenuation ratio $g_0$.

Finally referring to FIG. 10, an attenuator 13$k$6 which is a still further modification of the attenuator 13$k$1 and which comprises in the passive circuit element networks other passive circuit elements beside the resistors, comprises one (not shown) of a pair of input terminals that is always connected to the earth and one (not shown) of a pair of output terminals that is always grounded; a two-state switch 20 which assumes either of two states according to the control input $e_k$ and which is maintained at the earth or the reference potential at a point which may be connected either to the 0 contact 350 or to the 1 contact 351; and a passive circuit element combination composed of a passive circuit element network which consists of an input-side resistor 31, an inductor 41 serially connected thereto, an inter-input-and-output resistor 32, and a capacitor 42 connected in parallel to the latter resistor 32 and which may be connected when the control input $e_k$ to the two-state switch 20 is 0, to the earth and consequently to those input and output terminals (not shown) at the 0 contact 350 disposed at one end of the serial connection of the resistor 31 and the inductor 41, to the shown input terminal 16 at both the other end of the serial connection and one end of the parallel connection of the resistor 32 and the capacitor 42, and to the shown output terminal 17 at the other end of the parallel connection, and another passive circuit element network which consists of the inter-input-and-output parallel connection 32 and 42 and an output-side serial connection of a resistor 33 and a second inductor 43 and which may be connected when the control input $e_k$ is 1, to the earth at a 1 contact 351 disposed at one end of the resistor 33 and the second inductor 43, to the shown input terminal 16 at one end of the parallel connection 32 and 42, and to the shown output terminal 17 at the other ends of both the serial and the parallel connections. It is possible to prevent the attenuation ratio of the attenuator from deviating on high-speed decoding from the aimed value by so selecting the impedances of the inductor 41, capacitor 42, and the second inductor 43 that peaking or frequency compensation of the attenuation characteristics may be attained.

While I have described above the principles of my invention in connection with specific apparatus, it is to be clearly understood that this description is made only by way of example and not as a limitation to the scope of my invention, as set forth in the objects thereof and in the accompanying claims.

What is claimed is:

1. A decoding circuit with nonlinear companding characteristics for providing from a plurality of digits of a codeword representing an analogue signal a quantized analogue signal represented by said digits, comprising:

(1) a reference power source for producing across a pair of its terminals a predetermined reference power, one of said terminals constituting a ground potential terminal; and (2) a plurality of spatially cascaded attenuator stages corresponding to said digits, each having (a) a pair of input terminals, one of which is connected to said ground potential terminal, (b) a pair of output terminals, one of which is connected to said ground potential terminal, (c) a resistance network in turn having first, second, and third arms each being composed of at least one resistor, said first arm being connected between said input and output terminals, said second arm being connected at its one end to the input-terminal side of said first arm, said third arm being connected at its one end to the output-terminal side of said first arm, (d) a common potential terminal connected to said ground potential terminal, (e) a digit code element input terminal for receiving corresponding one of said digits, and (f) a two-state switch for selectively connecting in response to said corresponding digit one of the other ends of said second and third arms to said common potential terminal;

said input terminals of the first one of said stages being connected to said terminals of said power source, said input terminals of each of said stages except said first one being connected to the output terminals of a preceding adjacent one of said stages, said output terminals of the last one of said stages constituting analogue signal output terminals for delivering said quantized analogue signal; and said resistance network having an attenuation ratio determined with reference to a resistance connected across the output terminals of said stage and the desired nonlinear companding characteristics, by a predetermined law, the stage to which it belongs, and the value of said code element.

2. A decoder comprising a decoding circuit as claimed in claim 1 wherein the number of attenuation stages is equal to the number of digits in a codeword.

References Cited by the Examiner

UNITED STATES PATENTS

| | | | |
|---|---|---|---|
| 2,718,634 | 9/1955 | Hansen | 340—347 |
| 2,976,527 | 3/1961 | Smith | 340—347 |

MAYNARD R. WILBUR, *Primary Examiner.*

DARYL W. COOK, *Examiner.*

A. L. NEWMAN, *Assistant Examiner.*